US012781335B2

(12) United States Patent
Braun et al.

(10) Patent No.: US 12,781,335 B2
(45) Date of Patent: Nov. 3, 2026

(54) THERMAL LASER EVAPORATION SYSTEM

(71) Applicant: MAX-PLANCK-GESELLSCHAFT ZUR FÖRDERUNG DER WISSENSCHAFTEN E.V., Munich (DE)

(72) Inventors: Wolfgang Braun, Bietigheim-Bissingen (DE); Jochen Mannhart, Böblingen (DE)

(73) Assignee: Max-Planck-Gesellschaft zur Förderung der Wissenschaften e. V., Munich (DE)

( * ) Notice: Subject to any disclaimer, the term of this patent is extended or adjusted under 35 U.S.C. 154(b) by 594 days.

(21) Appl. No.: 18/274,348

(22) PCT Filed: Jan. 27, 2021

(86) PCT No.: PCT/EP2021/051881
§ 371 (c)(1),
(2) Date: Jul. 26, 2023

(87) PCT Pub. No.: WO2022/161605
PCT Pub. Date: Aug. 4, 2022

(65) Prior Publication Data
US 2024/0102151 A1 Mar. 28, 2024

(51) Int. Cl.
*B23K 26/064* (2014.01)
*B23K 26/12* (2014.01)
(Continued)

(52) U.S. Cl.
CPC .......... *C23C 14/28* (2013.01); *B23K 26/0643* (2013.01); *B23K 26/1224* (2015.10); *C23C 14/243* (2013.01); *C23C 14/564* (2013.01)

(58) Field of Classification Search
None
See application file for complete search history.

(56) References Cited

U.S. PATENT DOCUMENTS 5,098,737 A 3/1992 Collins et al.
5,889,626 A 3/1999 Fuse
(Continued)

FOREIGN PATENT DOCUMENTS

CN 1094848 A 11/1994
CN 101123295 A 2/2008
(Continued)

OTHER PUBLICATIONS

Office Action with Machine Translation dated Jul. 3, 2025 corresponding to Chinese Application No. 11420696180, 20 pages.

*Primary Examiner* — Jason Berman
(74) *Attorney, Agent, or Firm* — Dickinson Wright PLLC

(57) ABSTRACT

The present invention is related to a thermal laser evaporation system (10), the thermal laser evaporation system (10) comprising:
- a reaction chamber (20) with a chamber wall (30) for enclosing a reaction volume (22);
- a target (12) arranged in the reaction volume (22), the target comprising one or more materials (M) to be evaporated;
- a laser light source (40) for providing a thermal laser beam (42) for evaporating said one or more materials (M) from the target (12), the thermal laser beam having a general propagation direction (46); and
- a chamber window (38) in the chamber wall (30) for conducting the thermal laser beam (42) into the reaction volume (22).

19 Claims, 5 Drawing Sheets

(51) Int. Cl.

| | |
|---|---|
| ***C23C 14/24*** | (2006.01) |
| ***C23C 14/28*** | (2006.01) |
| ***C23C 14/56*** | (2006.01) |

(56) References Cited

U.S. PATENT DOCUMENTS

| | | | | |
|---|---|---|---|---|
| 2002/0040894 | A1* | 4/2002 | Borstel | B23K 26/0665 219/121.84 |
| 2010/0108883 | A1* | 5/2010 | Zewail | H01J 37/26 250/307 |
| 2010/0196624 | A1 | 8/2010 | Ruuttu | |
| 2016/0340770 | A1* | 11/2016 | Dai | C23C 14/5806 |
| 2017/0350000 | A1* | 12/2017 | Kekkonen | B23K 26/0624 |
| 2018/0253010 | A1* | 9/2018 | Hosoda | G03F 7/70033 |
| 2021/0355576 | A1 | 11/2021 | Braun | |

FOREIGN PATENT DOCUMENTS

| | | | |
|---|---|---|---|
| CN | 108950485 | A | 12/2018 |
| DE | 102018127262 | A1 | 4/2020 |
| JP | S5339274 | A | 4/1978 |

* cited by examiner

State of the art

THERMAL LASER EVAPORATION SYSTEM

CROSS-REFERENCES TO RELATED APPLICATIONS

This application is a 371 National Phase Application of International Application PCT/EP2021/051881, filed on Jan. 27, 2021, which is incorporated herein by reference in its entirety.

The present invention is related to a thermal laser evaporation system, the thermal laser evaporation system comprising:

- a reaction chamber with a chamber wall for enclosing a reaction volume;
- a target arranged in the reaction volume, the target comprising one or more materials to be evaporated;
- a laser light source for providing a thermal laser beam for evaporating said one or more materials from the target, the thermal laser beam having a general propagation direction; and
- a chamber window and the chamber wall for conducting the thermal laser beam into the reaction volume.

In thermal laser evaporation systems, laser light provided by a laser light source is directed onto the surface of the target for an evaporation of one or more materials provided by the target. Once a surface temperature of the target is sufficiently high, material begins to evaporate. Evaporated material moves within the reaction volume away from the surface of the target and is preferably deposited onto a surface of another target to be coated, which is also arranged within the reaction volume.

Unfortunately, the evaporation direction of the evaporated material is not only directed towards the target to be coated, but at least some of the evaporated material misses the target to be coated and is deposited elsewhere in the reaction chamber, in a worst-case onto the chamber window. Rather soon, the layer on the chamber window absorbs a dominant fraction of the incident laser light and in addition disturbs the shape of the transmitted laser beam so that the chamber window needs to be replaced. Without any precautions, this limits the possible uptime of such simple evaporation systems to only several hours.

Figure 1:
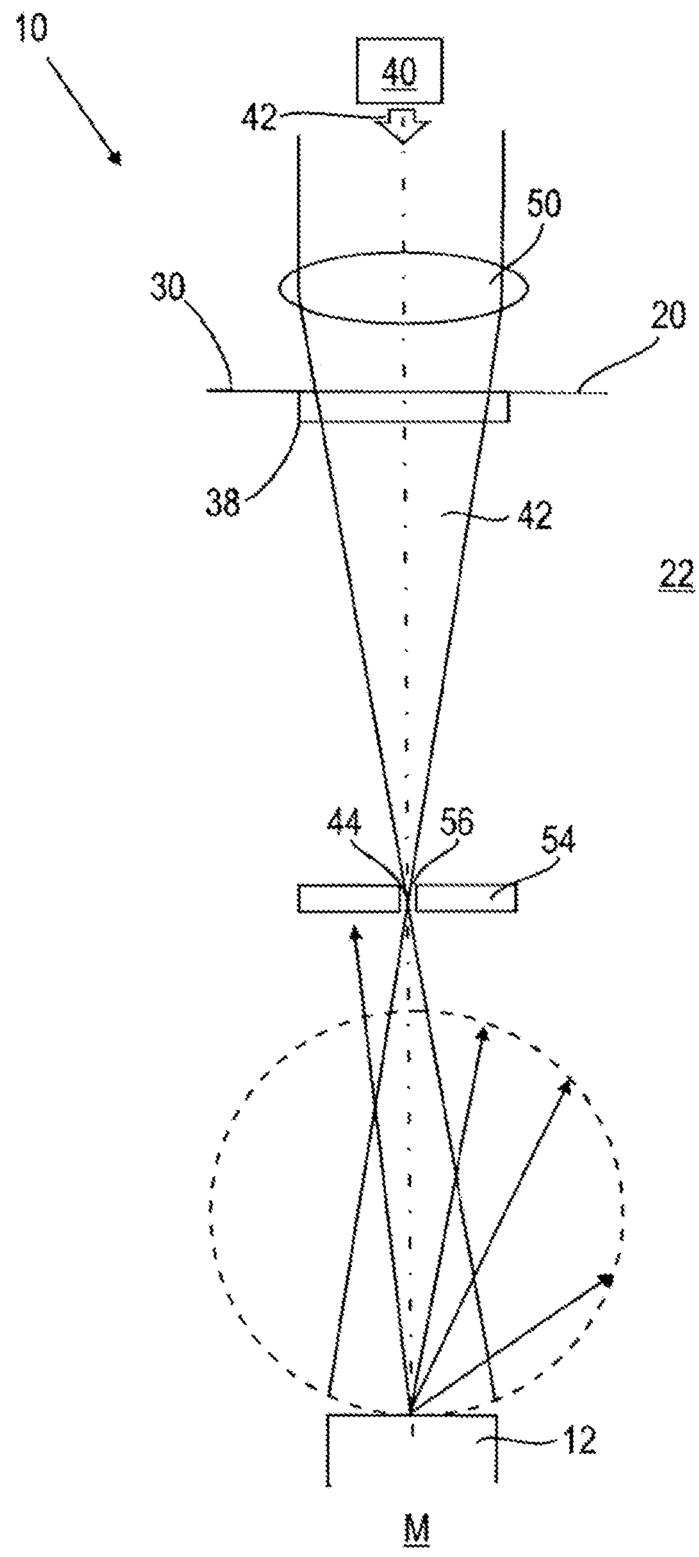

An embodiment of a laser evaporation system 10 according to the state-of-the-art providing an improvement with respect to the aforementioned drawbacks is shown in FIG. 1. A laser beam 42 provided by a laser light source 40 is focused by a focusing element 50 outside of the reaction chamber 20 onto a target 12 arranged within the reaction chamber 20 of the laser evaporation system 10. The laser beam 42 enters the reaction chamber 20 through the chamber window 38 in the chamber wall 30 of the reaction chamber 20. The laser beam 42 heats the target 12 until material M of the target 12 is evaporated and/or sublimated. Material M evaporated from the target 12 is indicated by arrows pointing away from the target 12.

To shadow the chamber window 38 from the evaporated material M, in the depicted embodiment of the laser evaporation system 10 according to the state-of-the-art an aperture 54 is arranged in the reaction volume 22 between the chamber window 38 and the target 12. The focusing element 50 focuses the impinging laser beam 42 such that a point-like focal volume 44 of the laser beam 42 spatially coincides with an aperture opening 56 of the aperture 54. Thereby, most of the material M emerging from the target 12 with a direction towards the chamber window 38 is blocked by the aperture 54.

However, as there remains a direct line-of-sight between the surface of the target 12 and the chamber window 38 through the aperture opening 56, material M still reaches the chamber window 38 and is deposited onto the chamber window 38. Hence, the aforementioned drawbacks of the coating of the chamber window 38 with evaporated material M are still present in laser evaporation systems 10 according to the state-of-the-art, however less dominant. Nevertheless, together with the aperture opening, the material M evaporated from the target 12 produces the image of a pinhole camera of the flux distribution on the surface of the chamber window 38, with the peak at the center of the chamber window 38. Since the flux of evaporated material M increases super-linearly with the power of the laser beam 42, this reduces the flux the most in the center of the laser beam 42, where normally most of the power is transmitted. The resulting uptimes, in particular when performing deposition reactions in ultra-high vacuum, are therefore low, in particular in the order of one day of evaporation.

In view of the above, it is an object of the present invention to provide an improved thermal laser evaporation system which does not have the aforementioned drawbacks of the state-of-the-art. In particular, it is an object of the present invention to provide a thermal laser evaporation system which allows an extension of an uptime of evaporation procedures compared to known thermal laser evaporation systems according to the state-of-the-art, in particular an uptime of at least six months, wherein in particular the uptime of the evaporation procedure is not limited by a deposition of evaporated material onto the chamber window.

This object is satisfied by the independent patent claim. In particular, this object is satisfied by the laser evaporation system according to claim 1. The dependent claims describe preferred embodiments of the invention.

In particular, the above object is satisfied by a thermal laser evaporation system, the thermal laser evaporation system comprising:

- a reaction chamber with a chamber wall for enclosing a reaction volume;
- a target arranged in the reaction volume, the target comprising one or more materials to be evaporated;
- a laser light source for providing a thermal laser beam for evaporating said one or more materials from the target, the thermal laser beam having a general propagation direction; and
- a chamber window and the chamber wall for conducting the thermal laser beam into the reaction volume.

The thermal laser evaporation system according to the present invention is characterized in that a mirror is arranged within the reaction volume, the mirror comprising at least one mirror body with at least one reflective surface to deflect the thermal laser beam coming from the chamber window onto the target, and wherein an aperture is arranged along a path of the laser beam within the reaction chamber between the mirror and the target.

The material to be evaporated is provided by a target arranged within the reaction volume. The thermal laser evaporation system according to the present invention can be used for evaporating and/or sublimating a wide range of materials, for instance for a deposition of said material onto a substrate also arranged within the reaction chamber. In the following, the expression “evaporating” also encompasses “sublimating”.

The thermal laser evaporation system comprises a reaction chamber enclosing a reaction volume. Within the reaction chamber and the reaction volume, respectively, a reaction atmosphere suitable for the desired evaporation reaction can be contained. This reaction atmosphere can for instance be a high or even ultra-high vacuum up to $10^{-9}$ mbar or even lower. Alternatively, also actual atmospheres comprising reactive gases, for instance ozone, are possible as a reaction atmosphere according to the present invention.

For the actual evaporation, a thermal laser beam provided by a laser light source is used. The laser beam comprises a general propagation direction, whereby this general propagation direction can be influenced and/or changed by suitable optical elements.

Further, the laser light source is arranged outside of the reaction chamber and the thermal laser beam is conducted through a chamber window into the reaction chamber and hence the reaction volume, respectively. Within the reaction volume, the thermal laser beam is directed onto the target containing the material to be evaporated. The energy deposit of the thermal laser beam into the target and hence into the material leads to the desired evaporation of the material.

As described above, the laser beam is conducted through the chamber window into the reaction chamber. According to the present invention, within the reaction volume a mirror is arranged for deflecting the laser beam. In other words, the mirror changes the general propagation direction of the laser beam coming from the chamber window such that the laser beam is directed onto the target.

For this, the mirror comprises at least one mirror body, whereby the at least one mirror body in turn comprises at least one reflective surface actually used for the aforementioned deflection of the laser beam. The mirror body can further comprise fixing means for fixing the mirror within the reaction chamber. Also, adjustment means for enabling an adjustment of the mirror, for instance for adjusting the propagation direction of the laser beam after the deflection on the reflective surface, are possible.

Beyond the mirror, the thermal laser evaporation system according to the present invention is also characterized in that additionally an aperture is arranged in the path of the laser beam between the mirror and the target. The aperture normally comprises an aperture opening adapted to the laser beam, in particular adapted to a diameter of the laser beam. Further, the aperture preferably is aligned perpendicular to the propagation direction of the laser beam.

In summary, the laser beam is provided by the laser light source with a first propagation direction, enters the reaction chamber through the chamber window and is within the reaction volume deflected by the reflective surface of the mirror into a second propagation direction and hence onto the target. Before the target, the laser beam additionally passes the aperture arranged between the mirror and the target.

As mentioned above, in the thermal laser evaporation system the intended use of evaporated material is a deposition onto another target arranged within the reaction chamber. However, the evaporation direction of the evaporated material is essentially random. Hence also an undesired deposition of the evaporated material on other surfaces within the reaction chamber can occur.

For suppression, preferably complete avoidance, of a coating of the chamber window with deposited material, the combination of mirror and aperture provided by the thermal laser evaporation system is crucial. In particular, evaporated material retracing the path of the laser beam and slipping through the aperture no longer hits the chamber window but is deposited onto the reflective surface of the mirror. Hence, the chamber window is protected from the evaporation flux. Instead, the reflective surface is now coated with evaporated material. However, this is much less severe than a coating of the chamber window, for the following reasons.

The mirror is a reflecting surface, in contrast to the transmission through the chamber window. Whereas the transmission of the chamber window drops rapidly, eventually to zero, when coated with the evaporated material, the reflectivity of the reflective surface drops much less rapidly. This holds true in particular for metals, which are the most common evaporated materials in thermal laser evaporation systems. In fact, the reflectivity of typical metals for the laser light beams range between 50% and close to 100%, which is then also the lowest reflectivity value to be expected of the reflective surface of the mirror coated with such a metal material.

A further deterioration of the mirror reflectivity can only take place once the surface roughness of the deposited layer on the reflective surface reaches a significant fraction of the wavelength of the laser beam provided by the laser light source. However, most films grow with a rather smooth surface, where the surface roughness is only a small fraction of the film thickness. Hence, coatings with a thickness not until $10^{-6}$ m or even thicker should be able to cause a significant attenuation of the deflected laser beam. At an assumed growth rate of $10^{-12}$ m/s of a deposited material layer on the reflective surface of the mirror, this leads to a corresponding further improvement of the mirror uptime.

In addition, as the material slipping through the aperture is deposited onto the mirror body, the chamber window preferably is not coated with material at all. Hence the uptime of the complete thermal laser evaporation system according to the present invention is limited only by the aforementioned uptime of the mirror. Hence, compared to a thermal laser evaporation system according to the state-of-the-art, the uptime can be raised from the aforementioned value of a few days of thermal laser evaporation systems according to the state of the art, to 0.5 to 5 years or even longer reachable with thermal laser evaporation systems according to the present invention.

Further, the thermal laser evaporation system according to the present invention can comprise that the mirror deflects the general propagation direction of the laser beam by 30° to 150°, in particular by 60° to 120°, preferably by 90°. The deflection angle can be chosen suitable for the present setup of the thermal laser evaporation system. In particular, an angle between 30° and 150°, in particular between 60° and 120°, preferably of 90°, ensures that the chamber window can be arranged with respect to the target at a significant different direction than the aperture and the mirror, respectively. An avoidance of a deposition of evaporated material onto the surface of the chamber window can thereby be ensured further.

In addition, the thermal laser evaporation system according to the present invention can be characterized in that the at least one mirror body is arranged within the reaction volume at a distance of less than 120 mm, in particular of less than 75 mm, preferably of less than 50 mm, to the chamber window. In other words, the at least one mirror body is arranged in the vicinity of the chamber window. An especially compact setup of these elements of the thermal laser evaporation system and of the complete system, respectively, can thereby be provided.

In another embodiment, the thermal laser evaporation system according to the present invention can comprise that the chamber wall comprises an elongated flange assembly, wherein the chamber window is arranged at one end of the flange assembly and the at least one mirror body of the mirror is arranged within the reaction volume, in particular at the other end of the flange assembly. As described above, the laser beam enters the reaction chamber through the chamber window in a first propagation direction, and the mirror deflects the laser beam into a second propagation direction onto the target. Preferably, the elongated flange assembly is aligned to the first propagation direction of the laser beam. The elongated flange assembly allows to recess the chamber window from the residual reaction volume and hence provides an additional shielding for the chamber window against evaporated material coming from the target. An avoidance of a deposition of evaporated material onto the surface of the chamber window can thereby be enhanced further.

Further, the thermal laser evaporation system according to the present invention can be characterized in that a blocking device is arranged within the reaction volume to block a direct line-of-sight between the target and the chamber window. Evaporated material coming from the target in most of the cases moves along a straight path through the reaction volume. This holds especially true if a high vacuum, or even ultra-high vacuum, forms the reaction atmosphere.

By arranging an additional blocking device, for instance a sheet of metal, in the reaction volume such that a direct line-of-sight between the target and the chamber window is blocked, evaporated material cannot reach the chamber window and instead is deposited onto the blocking device. Preferably, the blocking device completely blocks the direct line-of-sight between the target and the chamber window. A deposition of evaporated material onto the surface of the chamber window can thereby be avoided completely.

Preferably, the thermal laser evaporation system can be enhanced thereby that the blocking device is at least partly formed by the aperture and/or the chamber wall and/or the flange assembly. In this preferred embodiment, the blocking device is provided by elements already present in the reaction volume. As a result, a complexity of the setup of the thermal laser evaporation system according to the present invention can be reduced further.

In another embodiment, the thermal laser evaporation system according to the present invention can comprise that the thermal laser beam is focused on a point-like focal volume located in the reaction volume between the mirror and the target, and wherein the aperture comprises an aperture opening arranged at the focal volume. The point-like focal volume represents the smallest extent of the laser beam and hence the highest energy density. Providing this focal volume between the mirror and the target automatically ensures that the laser beam is divergent after the focal volume and hence the energy density decreases with increasing distance to the focal volume. If accidentally the target should be missed by the laser beam, this divergence ensures that the energy density at the impact on a chamber wall of the reaction chamber is low enough to cause no or at least no significant harm.

Further and as already described above, evaporated material moves also in the direction towards the aperture and hence towards the mirror. By providing a focal volume and by arranging the shielding aperture with its shielding aperture opening around this focal volume, the necessary size of the aperture opening can be minimized. A shielding of the mirror against deposition of evaporated target material can thereby be enhanced. Maintenance intervals for the mirror and hence the uptime of the complete thermal laser evaporation system according to the present invention can thereby be extended.

In a further improved embodiment of the thermal laser evaporation system according to the present invention, the at least one reflective surface is flat and the thermal laser beam is focused by a focusing element located outside of the reaction chamber on the point-like focal volume located in the reaction volume. Manufacturing a flat reflective surface is especially easy. Further, in this embodiment the focusing element is arranged outside of the reaction chamber and hence can be easily accessed for adjustment and/or maintenance.

Alternatively, the thermal laser evaporation system according to the present invention can comprise that the thermal laser beam is focused by the at least one reflective surface on the point-like focal volume. In other words, in this embodiment the aforementioned focusing element and the at least one reflective surface are integrated into a single optical element. Hence, the complexity of the optical setup of the thermal laser evaporation system can be reduced.

In another embodiment of the thermal laser evaporation system according to the present invention, the at least one reflective surface is a free-form surface. Such a free-form surface can take arbitrary forms and hence provide a plurality of optical properties. For instance, depending on the actual embodiment, such a free-form mirror can act as focusing or defocusing element. In an alternative or additional embodiment of the free-form mirror, it can also alter the shape of the reflected laser beam, both generally, for instance by transforming a cross section of the laser beam from circular to elliptical, and internally, for instance by transforming a uniform intensity distribution of the respective laser beam into a non-uniform, for instance ring-shaped, intensity distribution. In summary, the usage of a free-form surface as reflective surface opens up a plurality of possible applications of the mirror within the thermal laser evaporation system according to the present invention.

In addition, the thermal laser evaporation system according to the present invention can comprise that the mirror comprises adaptation means for actively adapting the form of the at least one reflective surface. Such adaptation means allow adjusting the properties of the mirror during the usage of the mirror without the need of a replacement of the mirror. In particular, the adjustable properties can reach from simply adjusting an angle of the reflective surface with respect to the propagation direction of the impinging laser beam and thereby also changing the propagation direction of the deflected laser beam, up to arbitrarily shaping a reflective surface provided as free-form surface for altering and adjusting the respective optical properties provided by the mirror with this free-form surface as reflective surface. Preferably, the adjustment can be achieved by the adaptation means within the reaction chamber and in particular without the need to open the reaction chamber. Further, the adaptation means can preferably be controlled remotely, for instance mechanically, by wire and/or wireless.

Preferably, the thermal laser evaporation system according to the present invention can be characterized in that the mirror comprises a cooling means for compensating an application of energy deposited in the mirror during deflecting the laser beam. Even if the laser beam is almost fully deflected by the mirror, nevertheless some of its energy is deposited into the at least one mirror body of the mirror. This can ultimately lead to a change of shape of the reflective surface of the mirror and hence ultimately to a loss of performance of the thermal laser evaporation system. By providing cooling means, said energy deposited into the mirror body can be compensated.

Generally, the cooling means can transport the energy deposited into the mirror body away from reflective surface, preferably even as far as outside of the reaction chamber. An energy deposited by the reflection of the laser beam into the mirror body as detrimental factor for the performance of the reflective surface of the mirror body can thereby be prohibited or at least vastly diminished.

In addition, the thermal laser evaporation system according to the present invention can be further enhanced thereby that the cooling means comprises a cooling duct in the at least one mirror body for a flow of coolant through the mirror body.

Such a flow of coolant through a cooling duct is a very simple way of providing cooling means. The cooling duct is in particular arranged in the vicinity of the reflective surface for allowing an especially effective energy transfer away from the reflective surface. In addition, measuring the temperature of the coolant, for instance at an inlet and/or outlet of the cooling duct, preferably together with the flow rate of the coolant, allows monitoring the energy deposited into the mirror body by the reflected laser beam. As a coating of the reflective surface by deposition of evaporated material goes along with a reduction of reflectivity and hence an increase of absorption, this even allows to monitor said coating of the reflective surface. A need for replacement of the mirror due to said coating can thereby be timely detected.

In another preferred embodiment, the thermal laser evaporation system according to the present invention can comprise that the at least one mirror body consists of metal, in particular aluminum, wherein the at least one reflective surface is formed by a polished surface of the at least one mirror body. Using metal as material for the mirror body provides several advantages. First of all, most metals are firm materials which can be easily manufactured and machined. Secondly, metals are in particular suitable for usage in a high or even ultra-high vacuum environment, as they are clean materials with no significant component evaporation, in particular compared to for instance plastic materials. Further, polished surfaces of bodies consisting of metal comprise a high reflectivity up to almost 100% for laser light as used in the thermal laser evaporation system.

Further, the thermal laser evaporation system according to the present invention can be characterized in that the mirror comprises two or more mirror bodies, each with at least one reflective surface, wherein the two or more mirror bodies are arranged distanced to each other within the reaction chamber, and/or the at least one mirror body comprises two or more reflective surfaces. In other words, the mirror used in the thermal laser evaporation system according to the present invention can be split into several parts, both as separated mirror bodies and also as separated reflective surfaces on a single mirror body. Each of the present reflective surfaces can be formed individually, for instance flat, focusing or even as freeform. An especially good adaptation of the mirror on needs of the actual thermal laser evaporation system, for instance with respect to an available space, can thereby be provided.

The present invention is further described hereinafter with reference to illustrated embodiments shown in the accompanying drawings. There is shown:

FIG. 1A thermal laser evaporation system according to the state of the art,

FIG. 2A first embodiment of a thermal laser evaporation system according to the present invention, FIG. 3A second embodiment of a thermal laser evaporation system according to the present invention, FIG. 4A third embodiment of a thermal laser evaporation system according to the present invention, and FIG. 5A fourth embodiment of a thermal laser evaporation system according to the present invention.

Figure 2:
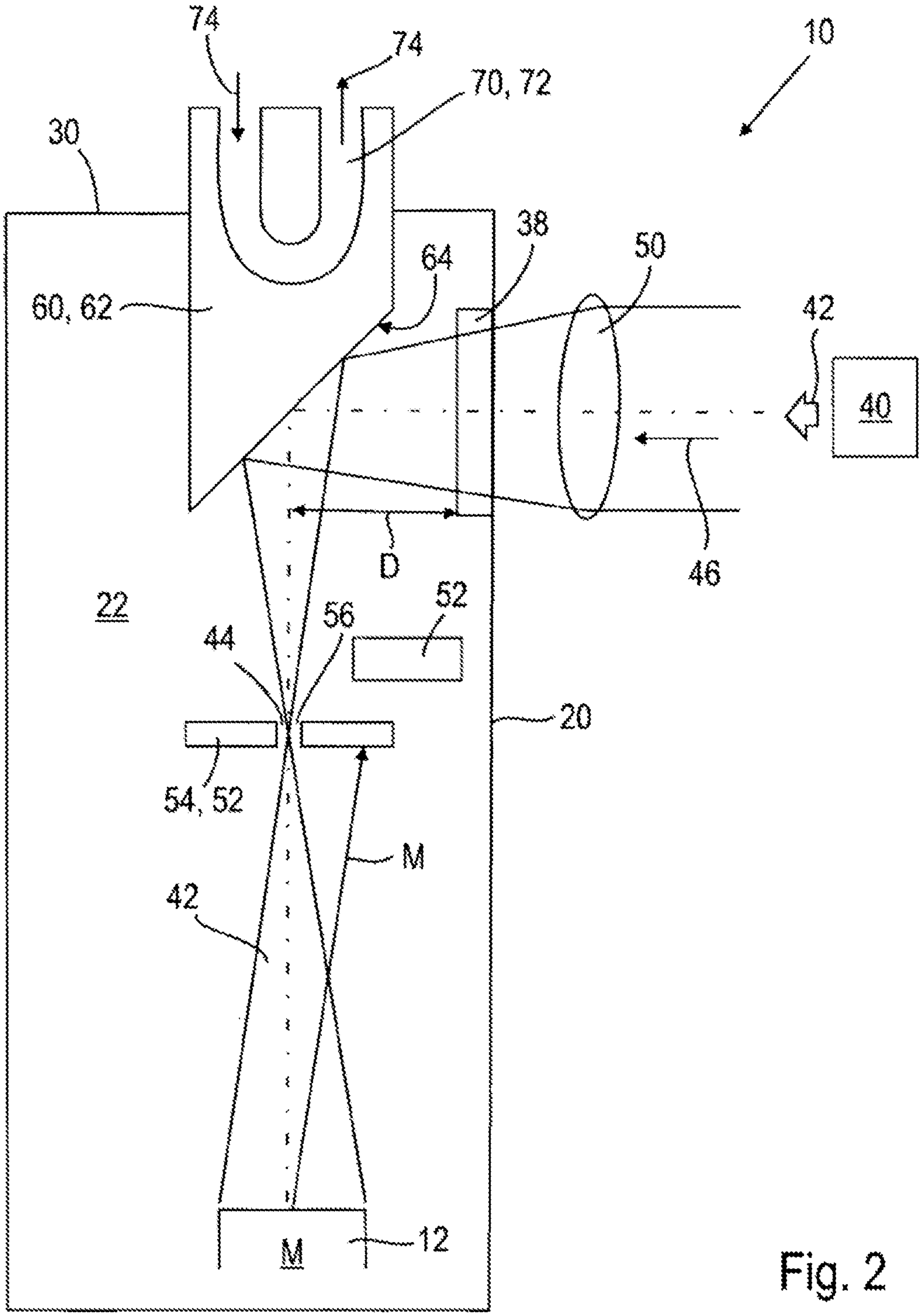

FIGS. 2 to 5 show different possible embodiments of the thermal laser evaporation system 10 according to the present invention. Please note that the general elements of the thermal laser evaporation system 10 described in the following with respect to FIG. 2 are also valid for the other embodiments of the thermal laser evaporation system 10 according to the present invention shown in FIGS. 3 to 5. Hence with respect to FIGS. 3 to 5, in particular the special features of the respectively depicted embodiment of the thermal laser evaporation system 10 will be described.

FIG. 2 shows a possible embodiment of a thermal laser evaporation system 10 according to the present invention. A target 12 containing at least one material M to be evaporated is arranged within a reaction volume 22 enclosed by a chamber wall 30 of a reaction chamber 20. The reaction volume 22 contains a reaction atmosphere, for instance a high or ultra-high vacuum or reaction gases needed for the desired reaction. Further elements, for instance pumps or similar means for maintaining the reaction atmosphere, are not shown.

For the evaporation, a laser beam 42 with a general propagation direction 46 provided by a laser light source 40 located outside of the reaction chamber 20 is used. The laser beam is coupled into the reaction volume 22 through a chamber window 38 arranged in the chamber wall 30. In the embodiment of the thermal laser evaporation system 10 depicted in FIG. 2, a focusing element 50 arranged outside of the chamber window 38 is used for focusing the laser beam 42 onto the target 12.

According to the present invention, within the reaction volume 22 both a mirror 60 and an aperture 54 are arranged in the path of the laser beam 42. The mirror 60 deflects the laser beam 42 in such that the propagation direction 46 of the laser beam 42 changes by 90°. In particular, the aperture 54 is arranged between the mirror 60 and the target 12. Material M evaporated from the target 12 (represented by the arrow M depicted in FIG. 2) can comprise arbitrary directions of movement (see also FIG. 1).

By providing the mirror 60 and the aperture 54, in a thermal laser evaporation system 10 according to the present invention, it can be assured that said evaporated material M does not reach the chamber window 38 and hence is not deposited onto the chamber window 38. Thereby, an uptime of the thermal laser evaporation system 10 according to the present invention in the order of years can be provided.

In particular, evaporated material M emerging from the target 12 can already be blocked by the aperture 54 as shown in FIG. 2. Preferably, the laser beam 42 is focused by the focusing element 50 into a point-like focal volume 44 between the mirror 60 and the target 12, and the aperture 54 is arranged and aligned with its aperture opening 56 to said focal volume 44. An especially small aperture opening 56 can thereby be realized, further minimizing the amount of material M slipping through the aperture opening 56 and impinging on the mirror 60.

Nevertheless, said material M slipping through the aperture opening 56 is deposited onto the reflective surface 64 on the mirror body 62 of the mirror 60 and hence can also not reach the chamber window 38. The deposition of the material M onto the mirror 60 is by far less severe than a deposition onto the chamber window 38, as deposited material M affects a transmission of laser light much more than a reflection.

Further, still possible paths of material M to the chamber window 38 can be blocked by additionally provided blocking devices 52 positioned in a direct line-of-sight between the target 12 and the chamber window 38. Preferably, already the aperture 54 or elements of the chamber wall 30 can form such blocking devices 52.

As mentioned above, in the embodiment shown in FIG. 2 the thermal laser evaporation system 10 comprises a focusing element 50 arranged outside of the reaction chamber 20. Hence the reflective surface 64 on the single mirror body 62 of the mirror 60 can be designed as a flat surface. Preferably, the mirror body consists of metal, in particular aluminum, and the reflective surface 64 is provided by a polished surface of the metal mirror body 62.

The mirror 60 is preferably arranged at a small distance D to the chamber window, for example at a distance D of 50 mm. This allows an especially compact setup of the elements in the path of the laser beam 42 and thereby of the complete thermal laser evaporation system 10. In this particular embodiment with a focusing element 50 arranged outside of the reaction chamber 20, it also maximizes the beam diameter on the mirror surface 64 of the converging beam to keep the power density of the beam 42 on the mirror surface at a minimum. This reduces or avoids a deformation of the reflective surface 64.

Further, in the depicted embodiment the mirror 60 comprises cooling means 70, in particular a cooling duct 72 for a flow of a coolant 74 through the mirror body 62. Energy deposited into the mirror body 62 by the deflected laser beam 42, which can ultimately lead to a deformation of the reflective surface 64, can thereby be absorbed by the coolant 74 and hence transported away from the reflective surface 64.

Figure 3:
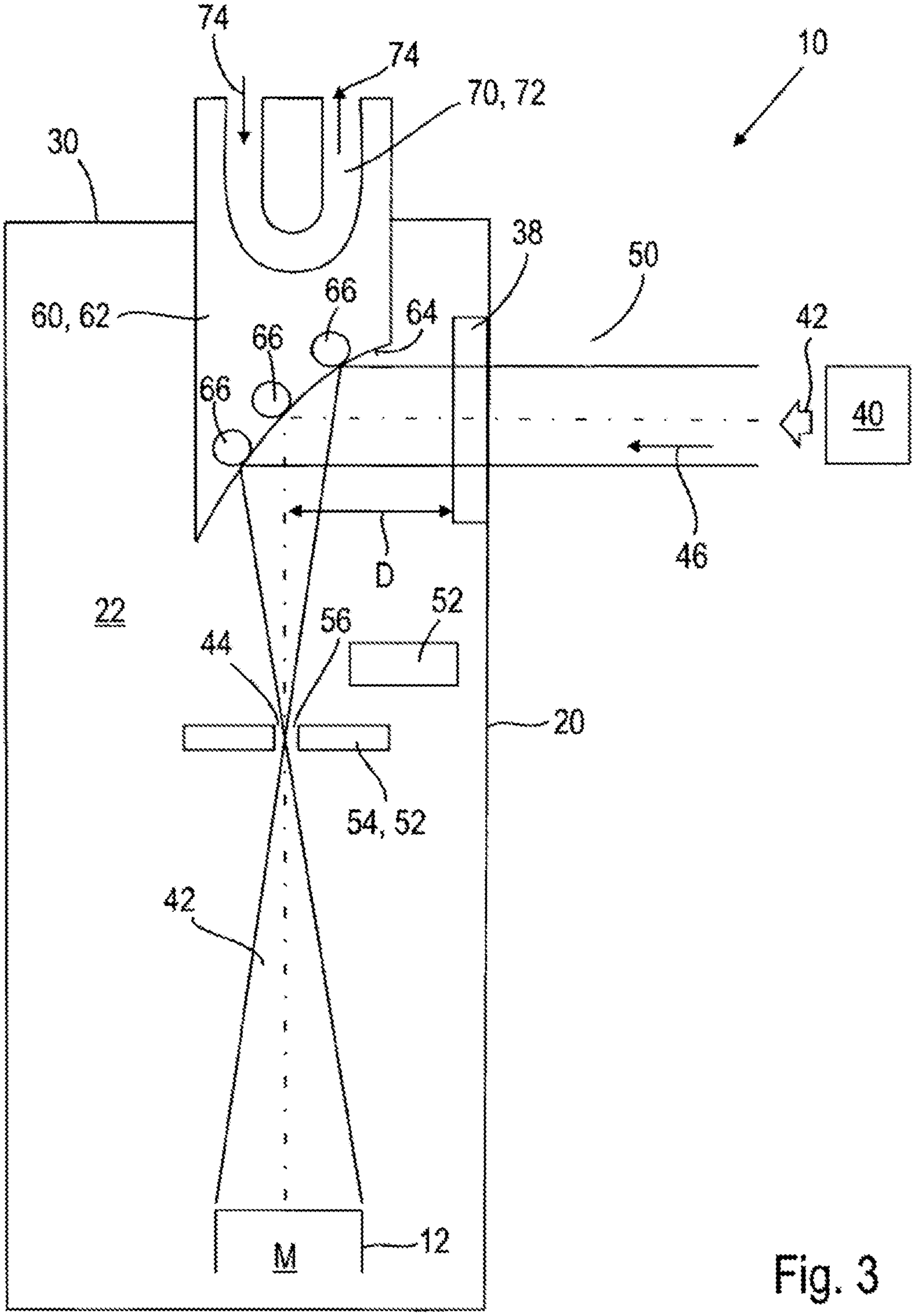

In contrast to the embodiment of the thermal laser evaporation system 10 according to the present invention shown in FIG. 2, the respective embodiment of FIG. 3 lacks a separate focusing element 50 arranged outside of the reaction chamber 20. However, in the depicted embodiment the mirror 60 itself focuses the laser light 42 onto the target 12, again via a point-like focal volume 44 arranged in between the mirror 60 and the target.

Further, in this embodiment the reflective surface 64 is provided as free-form surface, which can be adaptively formed to provide the desired optical property. Additionally to the focusing property, for instance also changing the overall shape of the laser beam 42 is possible.

In addition, the depicted mirror 60 is an adaptive mirror 60 comprising adaptation means 66 for actively altering the form of the reflective surface 64. This allows for instance changing a focal length of the focusing mirror 60 and/or a change in the propagation direction 46, which the laser beam 42 comprises after deflection on the mirror 60.

For the remaining and not explicitly addressed features of the present embodiment of the thermal laser evaporation system 10 depicted in FIG. 3, please refer to the description with respect to FIG. 2.

Figure 4:
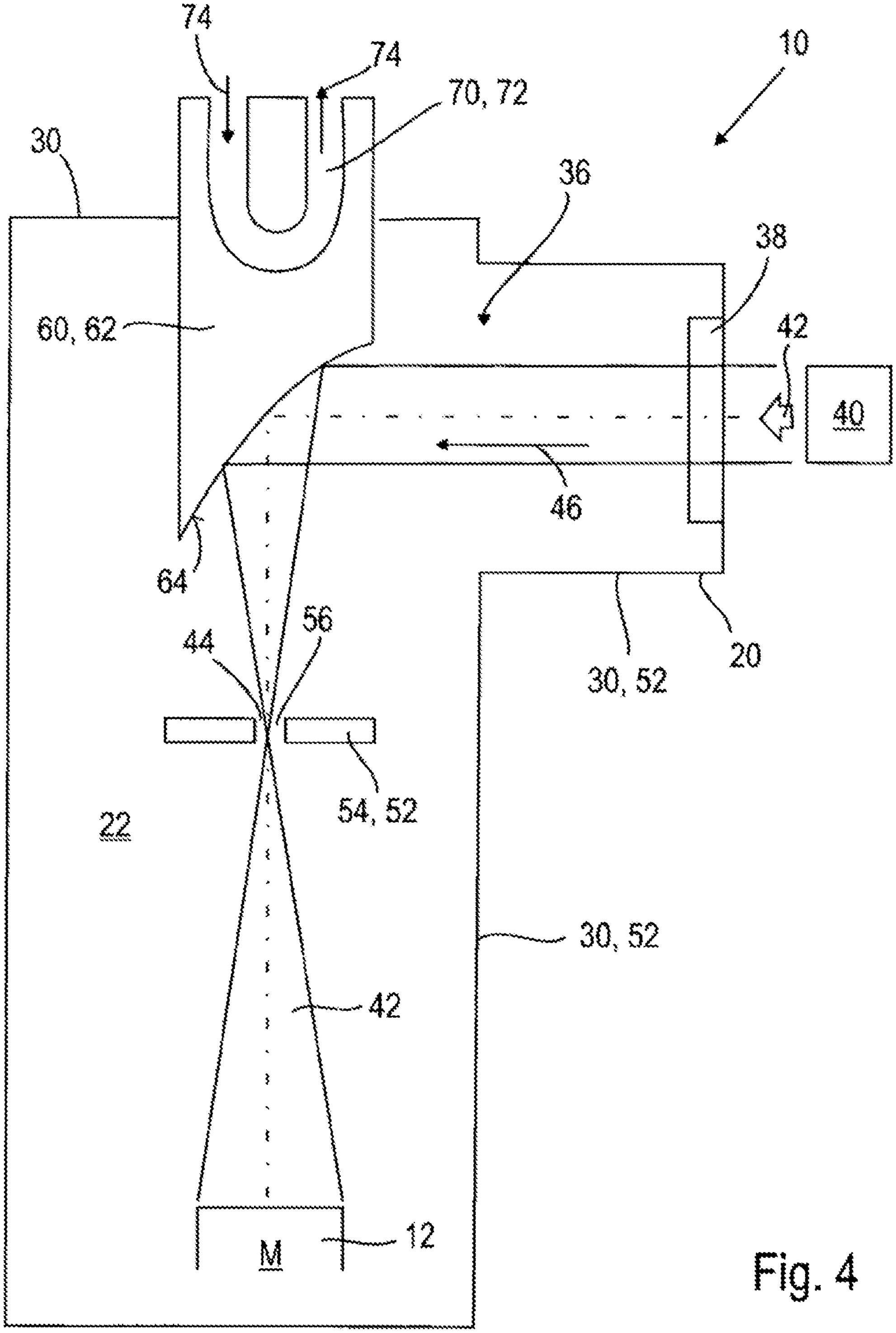

In FIG. 4, the reaction chamber 20 comprises an elongated flange assembly 32, wherein the chamber window 38 is arranged at one end 34 of the flange assembly 32, and the mirror 60 is arranged within the reaction volume 22 next to the other end 36 of the flange assembly 32. This flange assembly 32 allows to recess the chamber window 38 with respect to the residual reaction volume 22 and hence to further ensure that no material M evaporated from the target 12 can reach the chamber window 38. In other words, the chamber wall 30 forming the flange assembly 32 effectively is a blocking device 52 in the scope of the present invention.

For the remaining and not explicitly addressed features of the present embodiment of the thermal laser evaporation system 10 depicted in FIG. 4, again please refer to the description with respect to FIG. 2.

Figure 5:
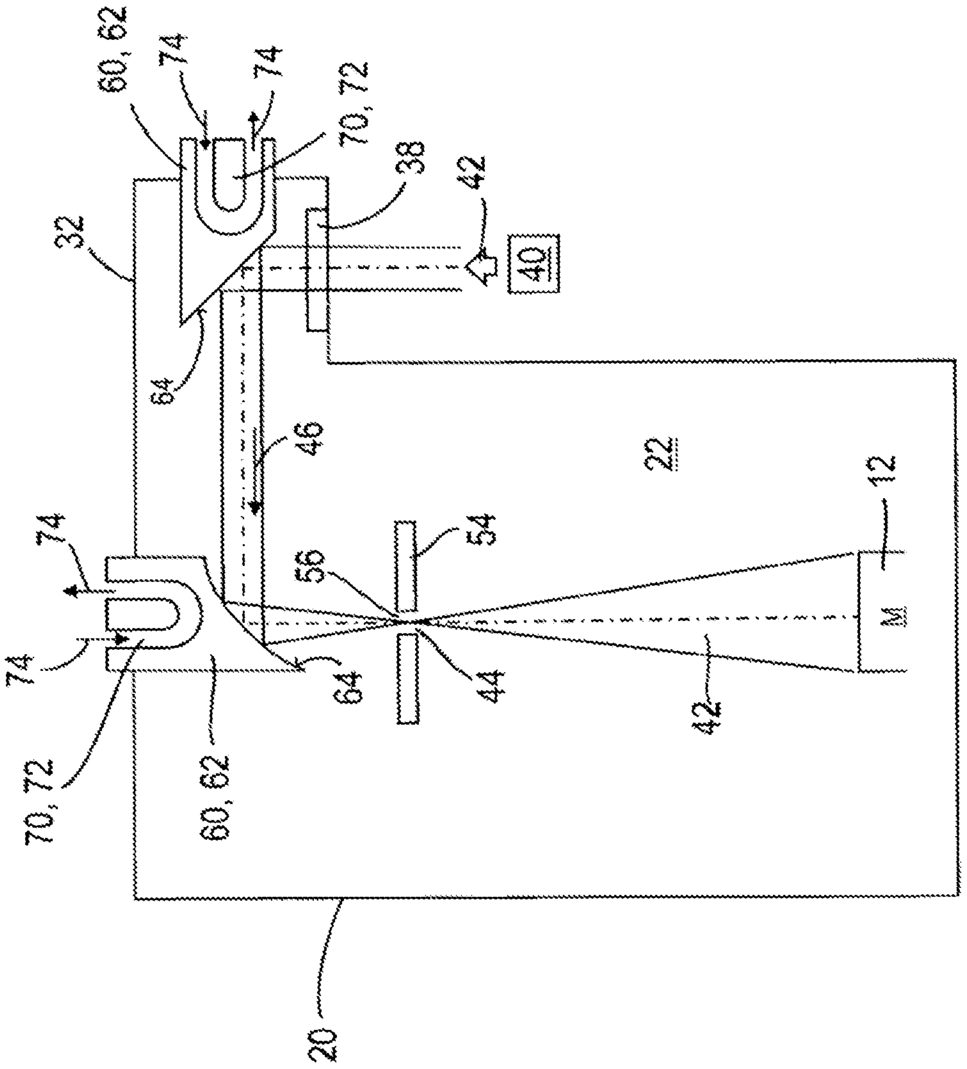

In the embodiment of the thermal laser evaporation system 10 according to the present invention shown in FIG. 5, the mirror 60 comprises two mirror bodies 62, and hence also the reflective surface 64 is split in two. An especially good and easy adaptation on requirements of the actual thermal laser evaporation system 10, for instance regarding an available space, can thereby be provided. As depicted, the different reflective surfaces 64 can comprise different optical properties. In addition and not depicted, also a single mirror body 62 can provide two or more separate reflective surfaces 64.

For the remaining and not explicitly addressed features of the present embodiment of the thermal laser evaporation system 10 depicted in FIG. 5, again please refer to the description with respect to FIG. 2.

REFERENCES

10 laser evaporation system
12 target
20 reaction chamber
22 reaction volume
30 chamber wall
32 flange assembly
34 one end of the flange assembly
36 other end of the flange assembly
38 chamber window
40 laser light source
42 laser beam
44 focal volume
46 propagation direction
50 focusing element
52 blocking device
54 aperture
56 aperture opening
60 mirror
62 mirror body
64 reflective surface
66 adaptation means
70 cooling means
72 cooling duct
74 coolant
D distance
M material

What is claimed is:

1. A thermal laser evaporation system, the thermal laser evaporation system comprising:

a reaction chamber with a chamber wall for enclosing a reaction volume;

a target arranged in the reaction volume, the target comprising one or more materials to be evaporated;

a laser light source for providing a thermal laser beam for evaporating said one or more materials from the target, the thermal laser beam having a general propagation direction; and a chamber window in the chamber wall for conducting the thermal laser beam into the reaction volume;

wherein a mirror is arranged within the reaction volume, the mirror comprising at least one mirror body with at least one reflective surface to deflect the thermal laser beam coming from the chamber window onto the target, and wherein an aperture is arranged along a path of the laser beam within the reaction chamber between the mirror and the target;

wherein the thermal laser beam is focused on a point-like focal volume located in the reaction volume between the mirror and the target, and wherein the aperture comprises an aperture opening arranged at the focal volume.

2. The thermal laser evaporation system according to claim 1, wherein the mirror deflects the general propagation direction of the laser beam by 30° to 150°.

3. The thermal laser evaporation system according to claim 1, wherein the at least one mirror body is arranged within the reaction volume at a distance of less than 120 mm to the chamber window.

4. The thermal laser evaporation system according to claim 1, wherein the chamber wall comprises an elongated flange assembly, wherein the chamber window is arranged at one end of the flange assembly and the at least one mirror body of the mirror is arranged within the reaction volume.

5. The thermal laser evaporation system according to claim 1, wherein a blocking device is arranged within the reaction volume to block a direct line-of-sight between the target and the chamber window.

6. The thermal laser evaporation system according to claim 5, wherein the blocking device is at least partly formed by the aperture and/or the chamber wall.

7. The thermal laser evaporation system according to claim 1, wherein the at least one reflective surface is flat and the thermal laser beam is focused by a focusing element located outside of the reaction chamber on the point-like focal volume located in the reaction volume.

8. The thermal laser evaporation system according to claim 1, wherein the thermal laser beam is focused by the at least one reflective surface on the point-like focal volume.

9. The thermal laser evaporation system according to claim 1, wherein the at least one reflective surface is a free-form surface.

10. The thermal laser evaporation system according to claim 1, wherein the mirror comprises adaptation means for actively adapting the form of the at least one reflective surface.

11. The thermal laser evaporation system according to claim 1, wherein the mirror comprises a cooling means for compensating an application of energy deposited in the mirror during deflecting the laser beam.

12. The thermal laser evaporation system according to claim 11, wherein the cooling means comprises a cooling duct in the at least one mirror body for a flow of coolant through the mirror body.

13. The thermal laser evaporation system according to claim 1, wherein the at least one mirror body consists of metal, wherein the at least one reflective surface is formed by a polished surface of the at least one mirror body.

14. The thermal laser evaporation system according to claim 1, wherein the mirror comprises two or more mirror bodies, each with at least one reflective surface, wherein the two or more mirror bodies are arranged distanced to each other within the reaction chamber, and/or the at least one mirror body comprises two or more reflective surfaces.

15. The thermal laser evaporation system according to claim 2, wherein the mirror deflects the general propagation direction of the laser beam by 60° to 120°.

16. The thermal laser evaporation system according to claim 3, wherein the at least one mirror body is arranged within the reaction volume at a distance of less than 75 mm to the chamber window.

17. The thermal laser evaporation system according to claim 4, wherein the chamber wall comprises an elongated flange assembly, wherein the chamber window is arranged at one end of the flange assembly and the at least one mirror body of the mirror is arranged within the reaction volume at the other end of the flange assembly.

18. The thermal laser evaporation system according to claim 13, wherein the metal is aluminum.

19. The thermal laser evaporation system according to claim 4, wherein a blocking device is arranged within the reaction volume to block a direct line-of-sight between the target and the chamber window, wherein the blocking device is at least partly formed by a flange assembly.

* * * * *